US012696401B2

(12) United States Patent
Duenkel et al.

(10) Patent No.: US 12,696,401 B2
(45) Date of Patent: Jul. 28, 2026

(54) HOUSING ELEMENT WITH TWO-PART ELECTRICAL CONTACT FOR AN ELECTRONIC CIRCUIT

(71) Applicant: TE Connectivity Solutions GmbH, Schaffhausen (CH)

(72) Inventors: Dirk Duenkel, Bensheim (DE); Gregor Panitz, Bensheim (DE)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 0 days.

(21) Appl. No.: 18/545,777

(22) Filed: Dec. 19, 2023

(65) Prior Publication Data

US 2024/0215179 A1 Jun. 27, 2024

(30) Foreign Application Priority Data

Dec. 22, 2022 (DE) .......................... 102022134501.7

(51) Int. Cl.
*H05K 5/00* (2025.01)
*H01R 13/50* (2006.01)

(52) U.S. Cl.
CPC .......... *H05K 5/0069* (2013.01); *H01R 13/50* (2013.01); *H05K 5/003* (2013.01)

(58) Field of Classification Search
CPC ...... H05K 1/185; H05K 1/117; H05K 5/0247; H05K 5/0069; H05K 5/003; H01R 12/585
See application file for complete search history.

(56) References Cited

U.S. PATENT DOCUMENTS

| | | | | |
|---|---|---|---|---|
| 11,855,394 | B2 * | 12/2023 | Blakborn | ........... H01R 13/6587 |
| 2007/0167037 | A1 * | 7/2007 | Thiel | ...................... H05K 3/308 439/70 |
| 2015/0079813 | A1 * | 3/2015 | Beer | .................... H01R 12/716 439/55 |

FOREIGN PATENT DOCUMENTS

| | | |
|---|---|---|
| CN | 107994362 A | 5/2018 |
| CN | 212323254 U | 1/2021 |
| DE | 102007018762 A1 | 9/2008 |
| JP | S5753577 U | 3/1982 |
| JP | 2001176616 A | 6/2001 |

(Continued)

OTHER PUBLICATIONS

Extended European Search Report for corresponding EP Application No. 23219057.9 dated Jun. 3, 2024.

(Continued)

*Primary Examiner* — Allen L Parker
*Assistant Examiner* — Dakota M Talbert
(74) *Attorney, Agent, or Firm* — Jay J. Hoette; Carroll, Hoette & Butscher, LLC

(57) ABSTRACT

A housing element for an electronic circuit includes a housing element body made from an insulating material with a through opening passing from a first side of the housing element body to a second side of the housing element body. An electrical contact passes through the opening. The electrical contact has a first contact element and a second contact element, wherein the first contact element is connected to the second contact element. The first contact element has a first direction of extent and the second contact element has a second direction of extent, wherein the first direction of extent and the second direction of extent have an angle of at least 45 degrees and no more than 135 degrees relative to each other.

12 Claims, 7 Drawing Sheets

(56)             References Cited

FOREIGN PATENT DOCUMENTS

| | | | |
|----|------------|----|---------|
| JP | 2004153034 | A  | 5/2004  |
| JP | 2007179877 | A  | 7/2007  |
| JP | 2007522684 | A  | 8/2007  |
| JP | 2015210937 | A  | 11/2015 |
| JP | 2017216079 | A  | 12/2017 |
| KR | 1020190031470 | A | 3/2019 |
| WO | 2014076122 | A1 | 5/2014  |

OTHER PUBLICATIONS

Office Action for corresponding KR Application No. 1020230188560 dated Nov. 20, 2024 (11 pages).

Office Action for corresponding JP Application No. 2023213440 dated Jun. 30, 2025 (11 pages).

Office Action for corresponding KR Application No. 1020230188560 dated Jul. 28, 2025 (11 pages).

Office Action for corresponding JP Application No. 2023213440 dated Jan. 28, 2025 (10 pages).

\* cited by examiner

HOUSING ELEMENT WITH TWO-PART ELECTRICAL CONTACT FOR AN ELECTRONIC CIRCUIT

CROSS REFERENCE TO RELATED APPLICATIONS

This application claims the benefit of DE Application No. 102022134501.7 filed 22 Dec. 2022, the subject matter of which is herein incorporated by reference in its entirety.

BACKGROUND OF THE INVENTION

The subject matter herein relates to a housing element for an electronic circuit.

Housings for electronic circuits are known in the prior art in which, for example, a circuit board is arranged in a fluid-tight housing. The housing can consist of two inter-connectable housing elements. Electrical contacts are integrated into one of the housing elements. Some electronic components require that the electrical contacts do not pass through the housing in a line and instead at an angle. The production of such a housing element is complex. For example, contacts can be inserted into a carrier, bent and then integrated into the housing element. This process is complex and expensive. An alternative is represented by the molding of already bent contacts into the housing element. However, the contacts can slip during the molding and undesired faulty contacts can thus occur such that a relatively high number of deficient housing elements can be anticipated.

There is a need for an improved housing element for an electronic circuit in which the production is less complex. There is a further need for an electronic component with such a housing element. There is yet a further need for a method for producing an improved housing element.

BRIEF DESCRIPTION OF THE INVENTION

According to a first aspect, the subject matter herein relates to a housing element for an electronic circuit. The housing element has a housing element body made from an insulating material. The housing element body has a through opening, wherein the opening passes from a first side of the housing element body to a second side of the housing element body. An electrical contact has a first contact element and a second contact element. The first contact element is connected to the second contact element. The first contact element is routed through the through opening. The first contact element has a first direction of extent and the second contact element has a second direction of extent. The first direction of extent and the second direction of extent have an angle of at least 45 degrees and no more than 135 degrees relative to each other.

In particular, it can be provided that the first contact element is plugged into the opening from the first side. Such a housing element is simple to produce because the housing element body can be created in one working step and the first contact element can be plugged into the housing body. If a plurality of electrical contacts are provided, the first contact element of each of these electrical contacts can be provided with its own opening which passes from the first side to the second side.

The housing element can be configured in such a way that it can be connected to a further housing element to form a housing. The electronic circuit can here be arranged in particular inside the housing.

According to a second aspect, the subject matter herein relates to an electronic component with a housing and an electronic circuit. The housing comprises a housing element according to the invention. The electrical contact of the housing element is connected to the electronic circuit. The housing has a further housing element, wherein the housing is sealed fluid-tightly by means of the housing element and the further housing element.

According to a third aspect, the subject matter herein relates to a method for producing a housing element according to the invention. It comprises the following steps. First, the housing element body is formed from insulating material in such a way that the through opening passes from the first side of the housing element body to the second side of the housing element body. The first contact element is then inserted into the opening, wherein the first contact element has the first direction of extent. The second contact element is inserted into the housing base body, wherein the second contact element has the second direction of extent. The first contact element and the second contact element are then connected to form the electrical contact in such a way that the first direction of extent and the second direction of extent have an angle of at least 45 degrees and no more than 135 degrees relative to each other. This can be effected, for example, by means of the directions in which the first contact element and the second contact element are plugged into the opening.

It can be provided that the first contact element is inserted into the through opening from the first side.

The embodiments described below for the housing element can in each case also be used in the method according to the invention.

In one embodiment, the second contact element likewise passes through the through opening. It can be provided as part of the production process that the second contact element is inserted, in particular plugged, into the through opening from the second side.

In one embodiment of the housing element, the first contact element has a recess. The second contact element has an element which can be plugged into the recess. A mechanically more stable connection between the first contact element and the second contact element can be provided as a result.

In one embodiment of the housing element, the recess and/or the pluggable element is deformed because of a connection between the first contact element and the second contact element. Improved contacting between the first contact element and the second contact element can be achieved as a result. In particular, a difference in dimensions between the first contact element and/or the second contact element, which exists because of the manufacturing tolerances, can be compensated by means of the deformation.

In one embodiment of the housing element, the recess is configured as a slot. The pluggable element is configured as a metal pin. Differences in the plugging depth which may occur when plugging in the first contact element can be compensated by the configuration of the recess as a slot.

In one embodiment of the housing element, the slot has a greater dimension parallel to the first direction of extent than perpendicular to the first direction of extent. In particular, the slot can have an essentially rectangular cross-section, wherein the longer side of the rectangle is directed parallel to the first direction of extent. It is intended here that essentially rectangular means that the slot has four straight sides which fundamentally form a rectangle but may be connected to one another via rounded corners. Moreover, the slot can alternatively have two parallel sides in the direction of the first direction of extent which are connected to each other by means of semicircular curves.

In one embodiment of the housing element, the recess is a through hole. The pluggable element can then pass through the through hole of the recess and thus produce a mechanically stable connection between the first contact element and the second contact element.

In one embodiment of the housing element, the first contact element has a plurality of recesses. The second contact element has a plurality of elements which can be plugged into the recesses. A current strength which can be transmitted by means of the electrical contact can, for example, be increased as a result.

In one embodiment of the housing element, the second contact element has a force-transmission surface. The force-transmission surface can serve, for example, to provide the connection between the first contact element and the second contact element by means of force on the second contact element.

In one embodiment of the housing element, the first contact element and the second contact element are at least partially tin-plated. The first contact element and the second contact element are cold-welded. In particular tin-plated contact elements can, in the case of mechanical contact, form a connection which is also mechanically stable by cold-welding. In particular those regions of the contact elements which touch each other can be tin-plated here.

In one embodiment of the housing element, the opening is angled. In particular, the opening can be angled in such a way that the first contact element cannot pass from the first side to the second side and in such a way that the second contact element cannot pass from the second side to the first side.

In one embodiment of the housing element, the housing element body has further openings and further electrical contacts. The electrical contacts are mutually insulated from one another. In particular, it can be provided that a separate opening of the housing body is assigned to each electrical contact. It can consequently be achieved that the electrical contacts are mutually insulated from each other because insulating material of the housing element body is in each case arranged between the electrical contacts.

In one embodiment of the housing element, a sealing element seals the opening at the first contact element and/or at the second contact element. A particularly fluid-tight housing can be provided as a result if the housing element is connected to a further housing element to form a housing.

In one embodiment of the housing element, the housing element body moreover has a collar for receiving a plug element. The collar is arranged parallel to the first direction of extent or parallel to the second direction of extent. The collar can be configured as a single piece with the housing element body.

The objects of the invention, the technical implementation of the solution and the advantages of the invention will become clear on the basis of the exemplary embodiments which will be described below with the aid of Figures, in which, shown schematically.

DETAILED DESCRIPTION OF THE INVENTION

Figure 1:
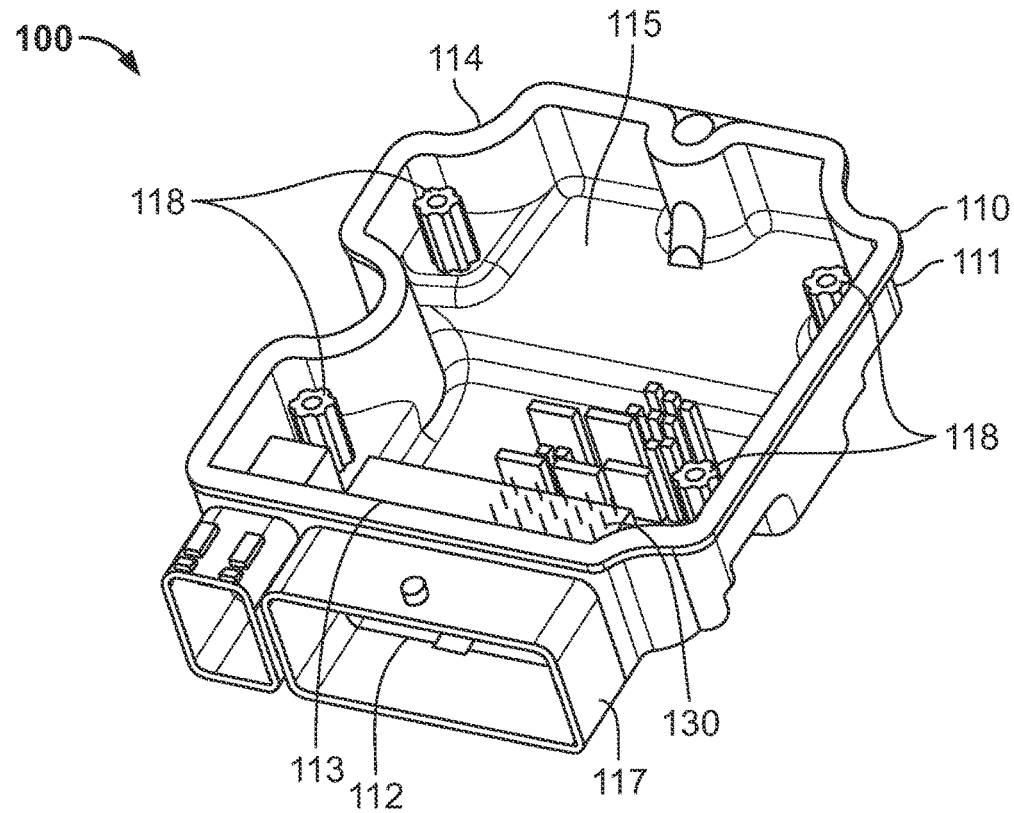
FIG. 1 shows a housing element in accordance with an exemplary embodiment.

FIG. 1 shows an isometric view of a housing element 100 for an electronic circuit. The housing element 100 has a housing element body 110 made from an insulating material 111. The housing element 100 moreover has an electrical contact 130 which passes from a first side 112 of the housing element body 110 to a second side 113 of the housing element body 110. The housing element body 110 is here constructed as a housing base body 114 with a depression 115, wherein an electronic circuit (not shown in FIG. 1) can be arranged inside the depression 115. The housing base body 114 can be sealed fluid-tightly with a cover. The housing base body 114 moreover has a collar 117, wherein the collar 117 is provided to receive a plug element. The housing base body 100 moreover has a screw socket 118 by means of which a cover can be screwed to the housing base body.

Figure 2:
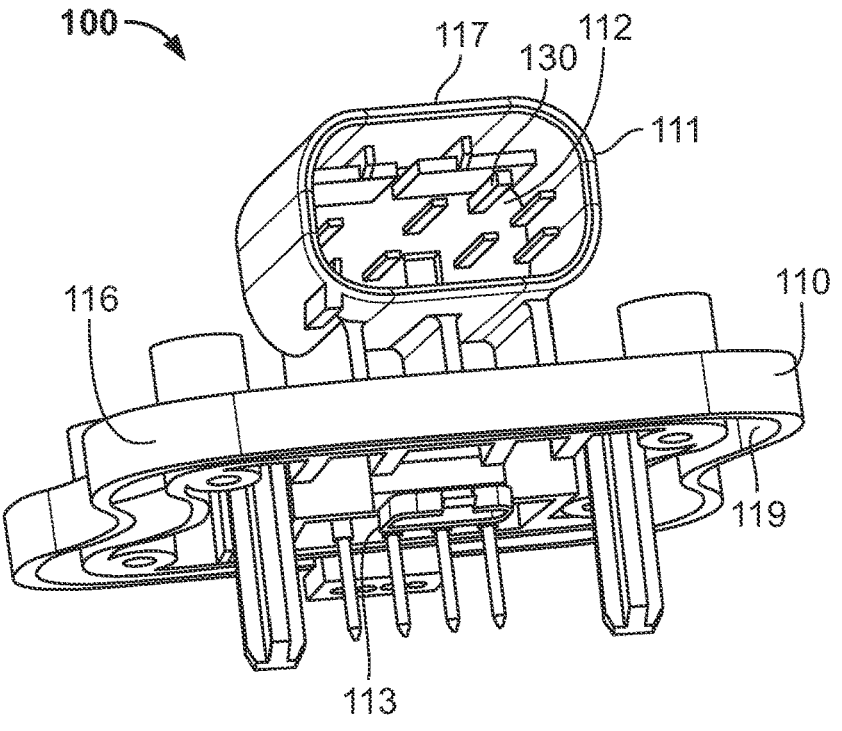
FIG. 2 shows a further housing element in accordance with an exemplary embodiment.

FIG. 2 shows an isometric view of a further housing element 100 for an electronic circuit. The housing element 100 likewise has a housing element body 110 made from an insulating material 111. The housing element 100 moreover has an electrical contact 130 routed from a first side 112 of the housing element body 110 to a second side 113 of the housing element body 110. The housing element body 110 is here constructed as a cover 116. A housing base body 114 can be sealed fluid-tightly with the cover 116. The housing base body 114 moreover has a collar 117, wherein the collar 117 is provided to receive a plug element. The housing base body 114 moreover has a sealing groove 119 into which a seal can be laid.

Figure 3:
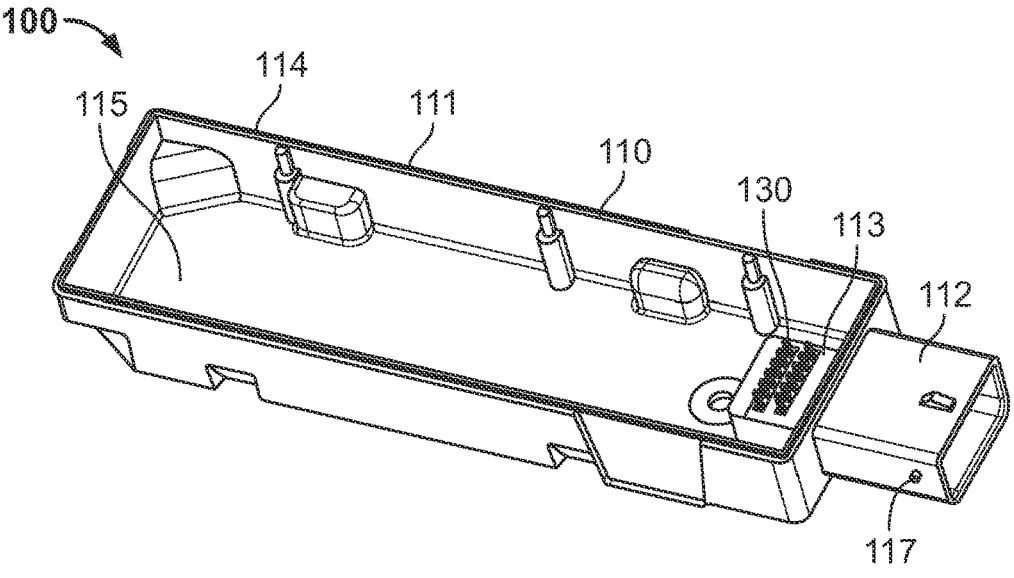
FIG. 3 shows a further housing element in accordance with an exemplary embodiment.

FIG. 3 shows an isometric view of a further housing element 100 for an electronic circuit. The housing element 100 has a housing element body 110 made from an insulating material 111. The housing element 100 moreover has an electrical contact 130 routed from a first side 112 of the housing element body 110 to a second side 113 of the housing element body 110. The housing element body 110 is here constructed as a housing base body 114 with a depression 115, wherein an electronic circuit (not shown in FIG. 1) can be arranged inside the depression 115. The housing base body 114 can be sealed fluid-tightly with a cover. The housing base body 114 moreover has a collar 117, wherein the collar 117 is provided to receive a plug element.

The electrical contacts 130 shown in the housing elements 100 in FIGS. 1 to 3 can have a certain configuration inside the housing base body 114 which will be explained in detail below in particular with reference to the housing element 100 in FIG. 3. The housing elements 100 in FIGS. 1 and 2 can, however, have identical features.

Figure 4:
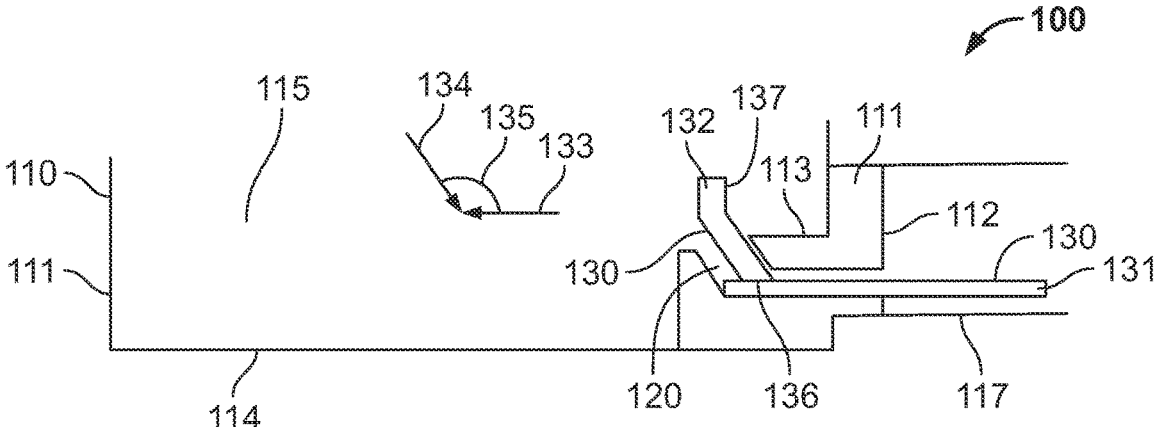
FIG. 4 shows a cross-section through a housing element in accordance with an exemplary embodiment.

FIG. 4 shows a cross-section through the housing element 100 in FIG. 3. The housing element body 110 has a through opening 120, wherein the opening 120 passes from the first side 112 of the housing element body 110 to the second side 113 of the housing element body 110. The electrical contact 130 has a first contact element 131 and a second contact element 132. The first contact element 131 passes through the opening 120 and is connected to the second contact element 132. The second contact element 132 optionally likewise passes through the opening 120. The first contact element 131 has a first direction of extent 133. The second contact element 134 has a second direction of extent 134. The first direction of extent 133 and the second direction of extent 134 have an angle 135 of at least 45 degrees and no more than 135 degrees relative to each other.

The first contact element 131 and the second contact element 132 here have an essentially elongated structure, wherein the first direction of extent 133 can relate to a maximum dimension of the first contact element 131 and the second direction of extent 134 to a maximum dimension of the second contact element 132. The first direction of extent 133 and the second direction of extent 134 can moreover be relative to the touch point 136 of the first contact element 131 and the second contact element 132. The second contact element 132 is angled at an upper end 137 but it is not intended that the second direction of extent 134 relates to the angled upper end 137 of the second contact element 132.

In the configuration in FIG. 4, the first side 112 is an outer side and the second side 113 is an inner side of the housing element body 110. Alternatively, the first side 112 can also be an inner side and the second side 113 an outer side of the housing element body 110. The opening 120 is moreover optionally angled, i.e. is not a linear through opening. In particular, the terms first side 112 and second side 113 here refer to from which side the first contact element 131 (first side 112) and the second contact element 132 (second side 113), respectively, are inserted into the opening 120. In the embodiment in FIG. 4, the second contact element 132 is used to contact the electronic circuit and the first contact element 131 is used for external contacting. This arrangement can generally be reversed such that the first contact element 131 is used to contact the electronic circuit and the second contact element 132 is used for external contacting.

In this embodiment, the angle 135 is optionally greater than 90 degrees, in particular for example 120 degrees. The housing element body 110 optionally moreover has a collar 117 for receiving a plug element. In the embodiment in FIG. 4, the collar 117 is arranged parallel to the first direction of extent 133. Alternatively, the collar 117 can also be arranged parallel to the second direction of extent 134, in particular when the second side 113 is the outer side of the housing element body 110.

In order to produce the housing element 100 in FIG. 4, the following steps can be performed. First, the housing element body 110 is formed from insulating material 111 in such a way that the through opening 120 passes from the first side 112 of the housing element body 110 to the second side 113 of the housing element body 110. Then, the first contact element 131 is inserted into the opening 120 from the first side 112, wherein the first contact element 131 has the first direction of extent 133. The second contact element 132 is inserted into the housing element body 110, in particular into the opening 120, from the second side 113, wherein the second contact element 132 has the second direction of extent 134. The first contact element 131 and the second contact element 132 are then connected to form the electrical contact 130 in such a way that the first direction of extent 133 and the second direction of extent 134 have an angle of at least 45 degrees and no more than 135 degrees relative to each other.

Figure 5:
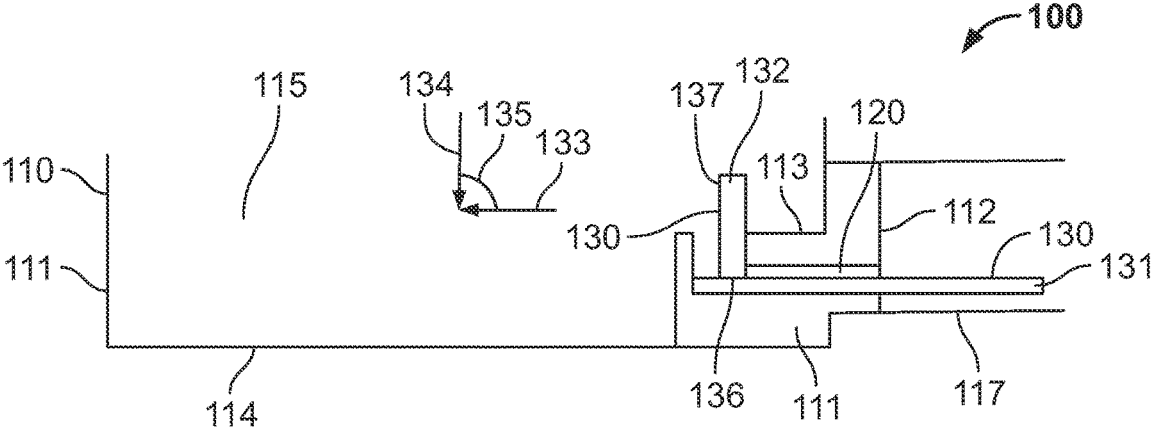
FIG. 5 shows a cross-section through a further housing element in accordance with an exemplary embodiment.

FIG. 5 shows a cross-section through a further possible embodiment of the housing element 100 in FIG. 3. This corresponds to the embodiment in FIG. 4 except for any differences described below. The first direction of extent 133 and the second direction of extent 134 are perpendicular to each other and the angle 135 is therefore 90 degrees.

Figure 6:
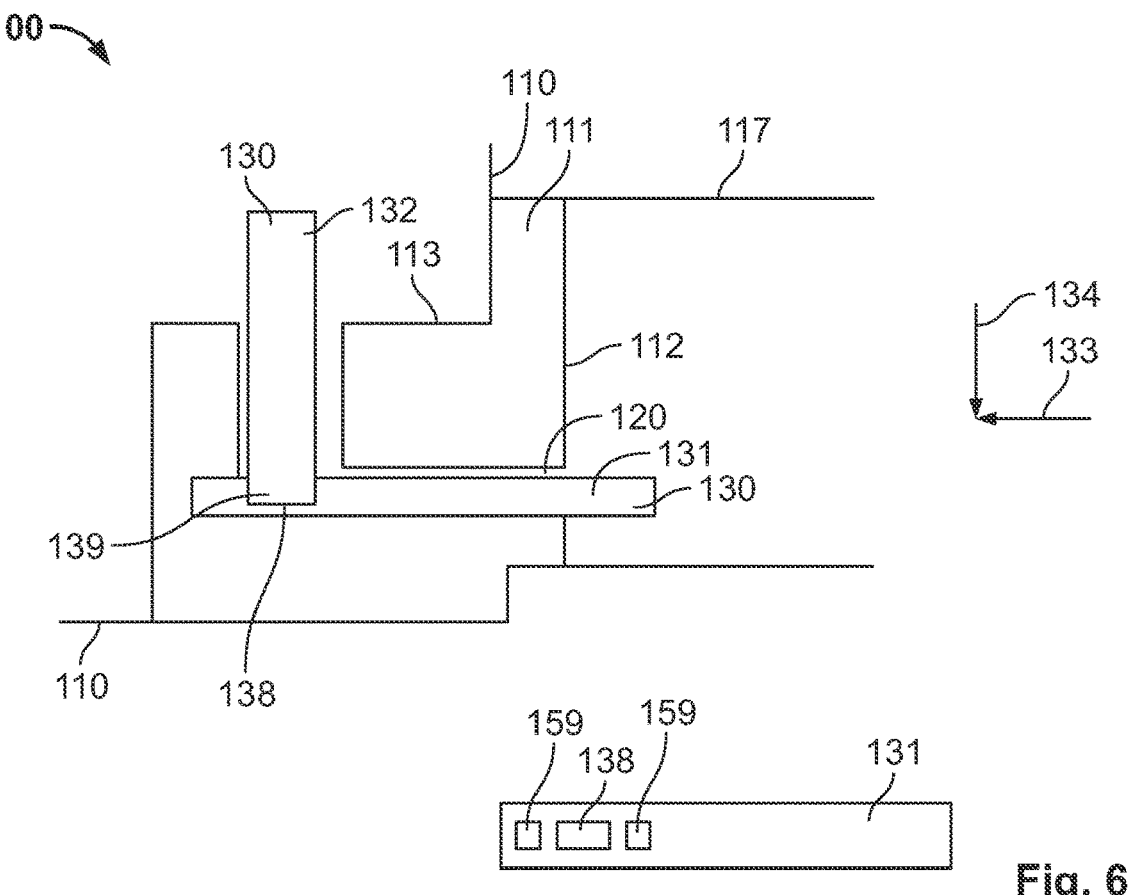
FIG. 6 shows a cross-section through a further housing element in accordance with an exemplary embodiment.

FIG. 6 shows a cross-section through a further housing element 100 which corresponds to the fundamental structure of the housing element 100 in FIG. 5 except for any differences described below. For greater clarity, only the region of the electrical contact 130 is illustrated in FIG. 6 and in particular not all of the housing base body 114 is illustrated. The first contact element 131 has a recess 138. The second contact element 132 has an element 139 which can be plugged into the recess 138. As a result, in particular locking can be achieved such that the first contact element 131 can no longer be removed from the opening 120 after the pluggable element 139 has been plugged into the recess. It is achieved as a result that the housing element 100 closes less quickly, for example when a plug element is plugged to the collar 117 and unplugged from it many times. Also illustrated in FIG. 6 is a plan view of the first contact element 131 with the recess 138. The recess 138 is square here but can, for example, also be round. It can be provided that the recess 138 and/or the pluggable element 139 is deformed by virtue of a connection between the first contact element 131 and the second contact element 132. When this housing element 100 is produced, it can be provided that the second contact element 132 is plugged into the first contact element 131. The first contact element 131 moreover has two optional strain relief recesses 159 which enable simpler deformation of the recess 138.

Figure 7:
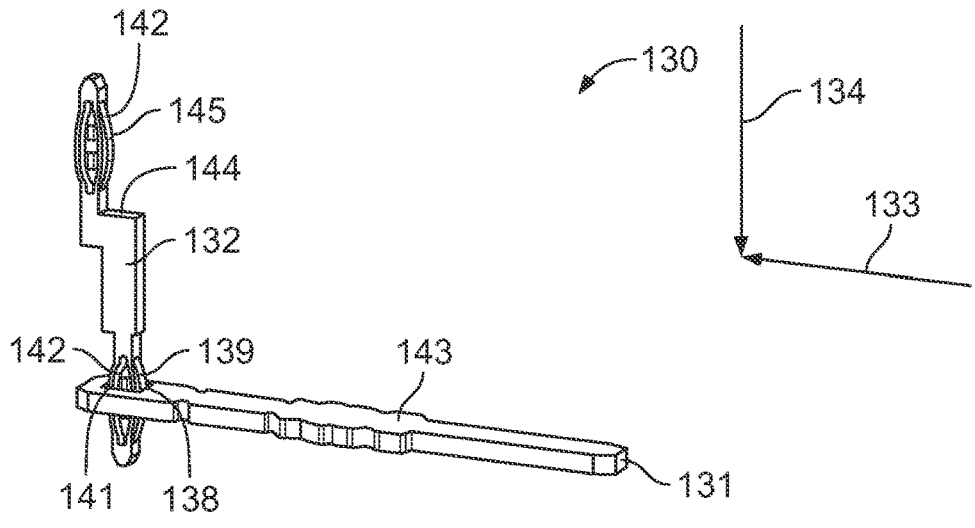
FIG. 7 shows an isometric view of an electrical contact in accordance with an exemplary embodiment.

FIG. 7 shows an isometric view of an electrical contact 130 which can be inserted into the housing elements 100 in FIGS. 1 to 6. The electrical contact in turn has a first contact element 131 with a recess 138 and a second contact element 132 with a pluggable element 139. The recess 138 is a through hole 141. It is optionally illustrated in FIG. 7 that the pluggable element 139 is a spring element 142. In particular, the spring element 142, i.e. the pluggable element 139, can be deformed when plugged into the through hole 141.

The first contact element 131 optionally has a coding 143 by means of which a plug element can be plugged onto the first contact element 131 only when the plug element has a coding matching the coding 143. The second contact element 132 moreover has an optional force-transmission surface 144. The force-transmission surface 144 can be used to exert a force on the second contact element 132 and, by means of the force, to insert the pluggable element 139 with the spring element 142 into the through hole 141 and thus to overcome a force of the spring element 142. For this purpose, the second contact element 132 is configured as angled and has in particular an offset. The second contact element 132 moreover optionally has a further pluggable element 145 which is also a spring element 142 and can be plugged, for example, into a printed circuit board of an electronic circuit. Optional strain relief recesses 159 can moreover be provided analogously to FIG. 6 which can likewise be through holes.

Figure 8:
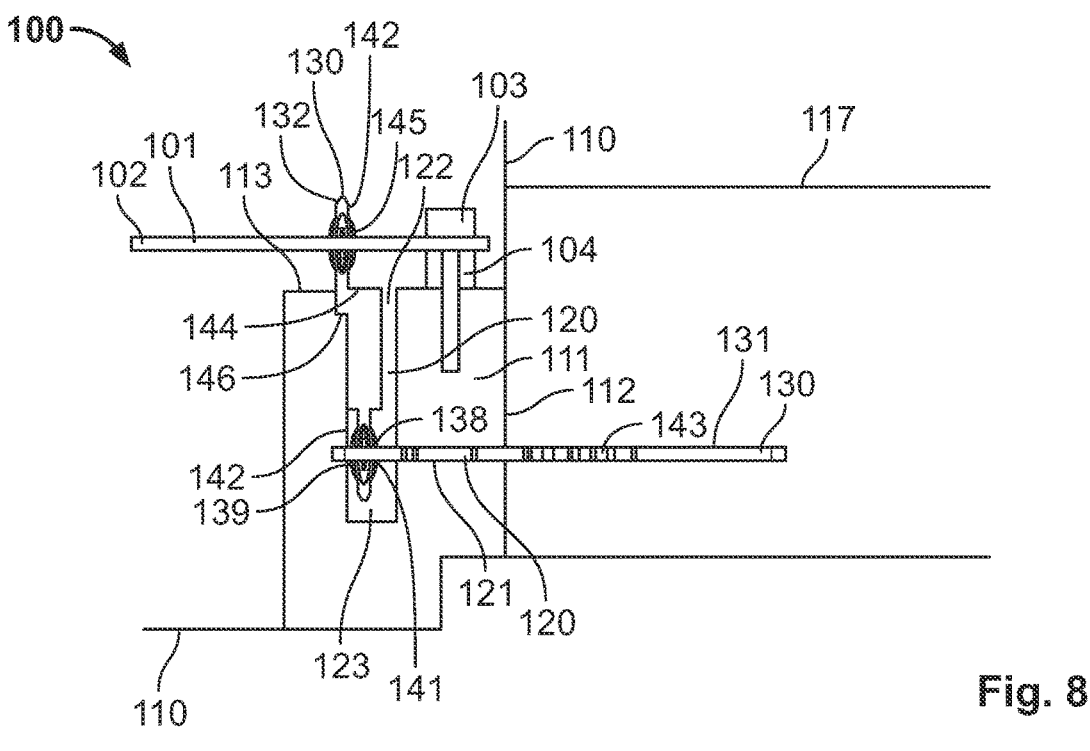
FIG. 8 shows a cross-section through a further housing element in accordance with an exemplary embodiment.

FIG. 8 shows a cross-section through a further housing element 100 which corresponds to the fundamental structure of the housing element 100 in FIG. 6 except for any differences described below. The electrical contact 130 is configured by means of the contact elements 131, 132 shown in FIG. 7 and has the properties described in connection with FIG. 7. The through opening 120 has a first partial opening 121 starting from the first side 112. The first partial opening 121 here has the same height as the first contact element 131. The through opening 120 moreover has a second partial opening 122 starting from the second side 113. When the housing element 100 in FIG. 8 is produced, the first contact element 131 can be inserted into the first partial opening 121, and the second contact element 132 can be arranged in the second partial opening 122 and plugged into the first contact element 131. In order to plug the second contact element 132 into the first contact element 131, it can be provided to exert a force on the force-transmission surface 144.

Also illustrated in FIG. 8 optionally is an electronic circuit 101 which is arranged on a circuit board 102, for example a PCB. Alternatively, other embodiments of the electronic circuit 101 are also conceivable. The circuit board 102 is screwed to the housing base body 114 by means of a screw 103 and a spacer ring 104. It can be provided here that, by means of this screw connection, a force is transmitted to the second contact element 132 and is diverted from the second contact element 132 into the housing base body by means of a further force-transmission surface 146. The further pluggable element 145 can then be used to contact the circuit board 102.

The opening 120 and in particular the second partial opening 122 here has a plug-in space 123 in which the pluggable element 139 of the second contact element 132 is arranged in the plugged-in state.

Figure 9:
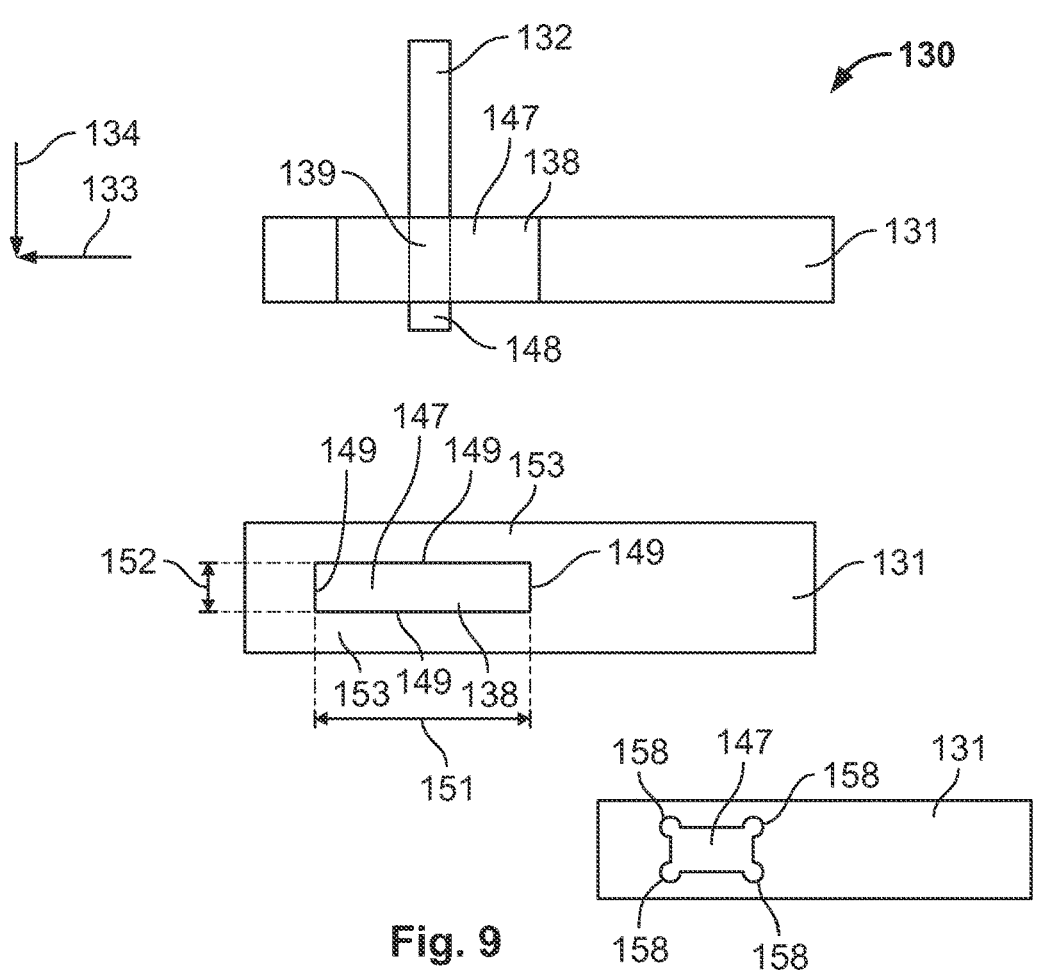
FIG. 9 shows a cross-section and a plan view of a further electrical contact in accordance with an exemplary embodiment.

FIG. 9 shows a cross-section of an electrical contact 130 which can be configured as explained in connection with FIG. 7 except for any differences described below. In particular, the features explained in connection with FIG. 7 and which are not illustrated in FIG. 9 can moreover be used, analogously to FIG. 7, in the case of the electrical contact 130 in FIG. 9. This can relate in particular to the coding 143 and the force-transmission surfaces 144, 146. The recess 138 is configured as a slot 147. The pluggable element 139 is configured as a metal pin 148. Moreover, illustrated in FIG. 9 is a plan view of the first contact element with the slot 147. In this case, in particular the pluggable element 139 is not flexible. It can be provided that the recess 138 is deformed by virtue of a connection between the first contact element 131 and the second contact element 132. The slot 147 can, as shown in FIG. 9, have a greater dimension parallel to the first direction of extent 133 than perpendicular to the first direction of extent 133. This can in particular mean that a length 151 of the slot 147 is greater than a width 152 of the slot 147, wherein the length 151 is in the direction of the first direction of extent 133.

As shown in FIG. 9, the slot 147 can have an essentially rectangular cross-section, wherein the longer side of the rectangle is directed parallel to the first direction of extent 133. It is intended here that essentially rectangular means that the slot 147 has, for example, four straight sides 153 which fundamentally form a rectangle but may be connected to one another via rounded corners. The slot 147 can moreover alternatively have two parallel sides 153 in the direction of the first direction of extent 133 which are connected to each other by means of semicircular curves. The slot 147 shown in FIG. 9 is configured as a through hole but can also, analogously to FIG. 4, just be a non-through recess 138.

The first contact element 131 has in the region of the slot 147 two webs 153 which are parallel to the first direction of extent 133. The webs 153 can here be deformed when the second contact element 132 is plugged into the first contact element 131, in particular deformed outwards. Discrepancies in the metal pin 148 and the slot 147 because of manufacturing tolerances may thus also be compensated. In particular, it can for example be provided that the maximum width 152 of the slot 147 with regard to manufacturing tolerances is smaller than the minimum dimension of the metal pin 148 in this direction, also with regard to manufacturing tolerances. It can, for example, be provided that the width 152 of the slot 147 is 0.35 millimeters with a tolerance of 0.025 millimeters. A width of the metal pin 148 would then have to be at least 0.375 millimeters. The length 151 of the slot 147 can be in the region of 1.4 millimeters. It can moreover be provided that the slot 147 is rounded with a radius of 0.175 millimeters and thus has two parallel sides 149 with a length of 0.7 millimeters and a spacing of 0.35 millimeters which are connected to each other by means of semicircular curves with a radius of 0.175 millimeters.

If a round metal pin 148 is provided at the second contact element 132, a corresponding slot 147 can also be used. Alternatively, the recess 138 can be a round through hole with a minimally smaller diameter than the metal pin 138, wherein further holes can then be arranged in addition to the through hole in order to facilitate deformation of the first contact element 131 in the region of the through hole. Moreover, a rectangularly configured through hole, for example configured as a slot 147, can have a corner strain relief 158, i.e. a milled hole which starts from the respective corners of the rectangle. In these cases too, the recess 138 is deformed by virtue of a connection between the first contact element 131 and the second contact element 132. Such a configuration of the first contact element 131 is also shown in FIG. 9.

Figure 10:
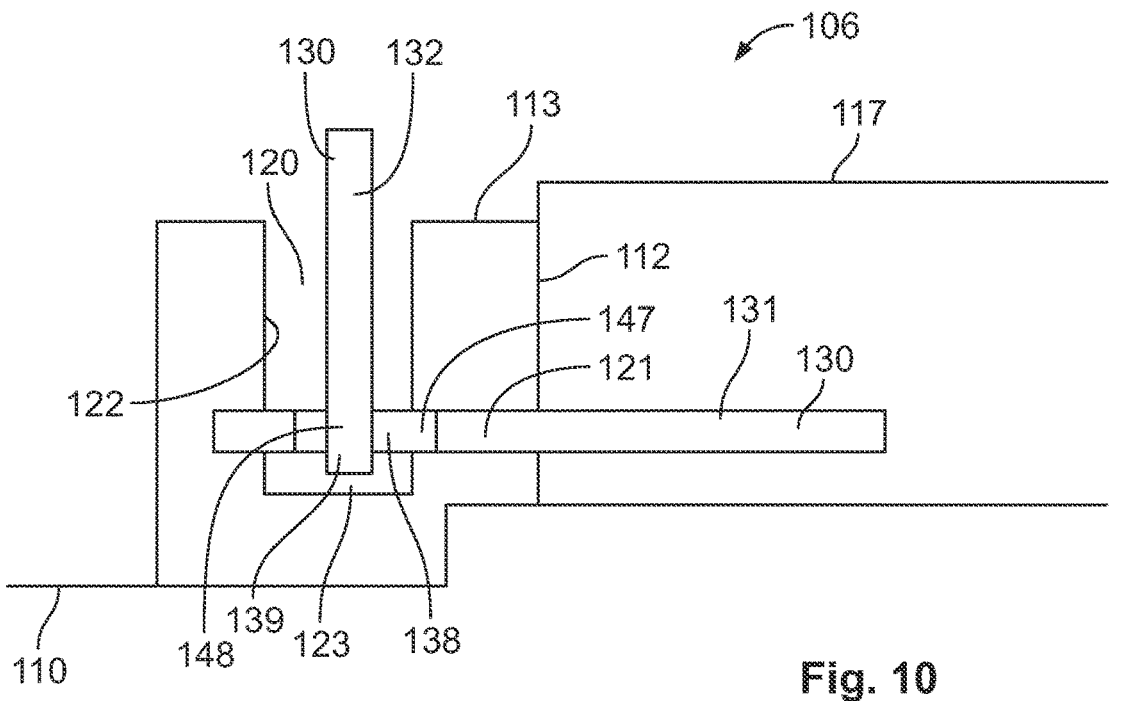
FIG. 10 shows a cross-section through a further housing element in accordance with an exemplary embodiment.

FIG. 10 shows a cross-section through a housing element 100, in which the electrical contact 130 from FIG. 9 is used and which otherwise corresponds to the embodiment in FIG. 8 except for any differences described below. Manufacturing tolerances of the housing element body 110 can be compensated by the use of the slot 147 at the first contact element and of the metal pin 148 at the second contact element. Moreover, the plug-in space 123 required for the metal pin 148 is reduced such that a more compact arrangement of the electrical contact 130 results.

Figure 11:
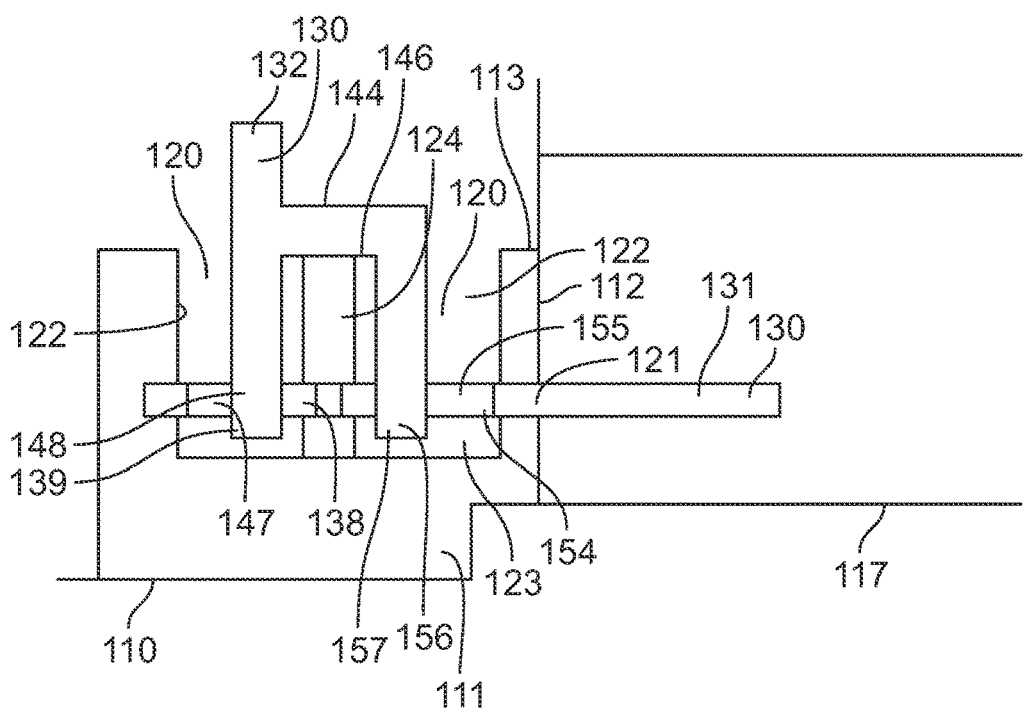
FIG. 11 shows a cross-section through a further housing element in accordance with an exemplary embodiment.

FIG. 11 shows a cross-section through a housing element 100 which corresponds to the embodiment in FIG. 10 except for any differences described below. The first contact element 131 has a further recess 154 which is configured as a further slot 155. The second contact element 132 has a further pluggable element 156 which is configured as a further metal pin 157. Generally, the first contact element 131 can have a plurality of recesses 138, 154 and the second contact element a plurality of elements 139, 156 which can be plugged into the recesses 138, 154. In particular, the embodiments, explained in connection with FIGS. 6 to 8, of the recesses 138, 154 and of the elements 139, 156 which can be plugged into the recesses 138, 154 can also be used. Because the second contact element 132 has a further pluggable element 156, the force-transmission surface 144 and the further force-transmission surface 146 result automatically. The further force-transmission surface 146 can here bear on an intermediate web 124 between the second partial openings of the opening 120.

The electrical contacts 130 shown in connection with FIGS. 4, 5, 6, 8, 10 and 11 are present in each case only individually within the plane of the drawing. It can, however, be provided to provide further electrical contacts, which can have a similar structure, in front of or behind the electrical contacts 130 shown within the plane of the drawing. They can in particular in each case have individual openings 120 such that an independent opening 120 is assigned to each electrical contact 130. The individual electrical contacts can be insulated from one another as a result. It can moreover be provided that the first partial opening 121 is a common opening and the second partial openings 122 are individually arranged openings, or vice versa, such that insulation of the electrical contacts from one another is also possible. The individual contact elements 131, 132 can here have a spacing from one another in the range from 1 to 3 millimeters. In particular, the spacing can be between 1.2 and 1.8 millimeters. Alternatively, a tenth of an inch (2.54 millimeters) or a twentieth of an inch (1.27 millimeters) can also be provided as the spacing.

Figure 12:
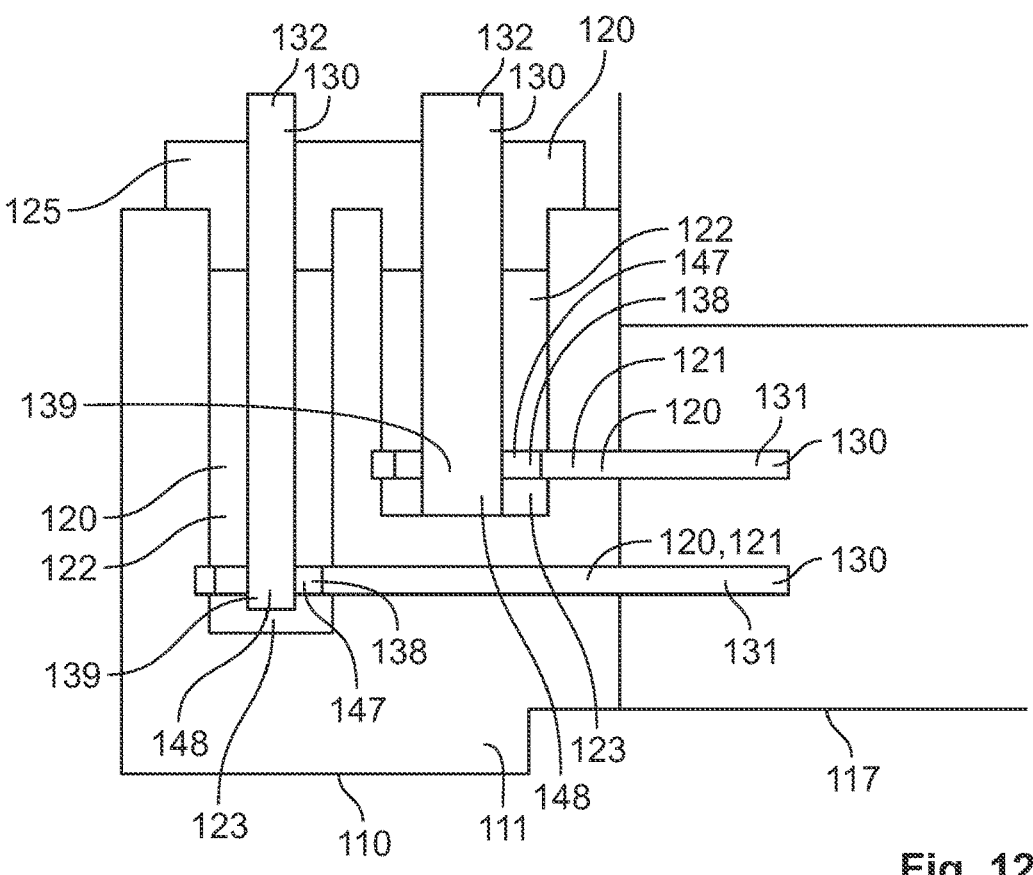
FIG. 12 shows a cross-section through a further housing element in accordance with an exemplary embodiment.

FIG. 12 shows a cross-section through a housing element 100 which corresponds to the embodiment in FIG. 10. Two electrical contacts 130, which are in particular electrically insulated from each other, are arranged in the plane of section because the respective openings 120 are separated from each other. The number of electrical contacts 130 can be increased as a result. This embodiment can in principle be used in the case of all the options explained for the electrical contacts 130 but in particular advantageously in the case of the embodiment with the recess 138 as a slot and with the pluggable element 139 as a metal pin 148, as is also shown in FIG. 12. A spacing between the contact elements 131, 132 can correspond to the spacings described in the last paragraph. Here too, further electrical contacts can be provided in front of or behind the electrical contacts 130 shown again within the plane of the drawing and they likewise have the properties described in the last paragraph.

An optional sealing element 125 is moreover shown in FIG. 12. The sealing element 125 seals the opening 120 at the second contact elements 132. It can alternatively be provided that the sealing element 125 seals the opening 120 at the first contact elements 131 (not shown in FIG. 12). The sealing element 125 can also be used in the case of the already described housing elements 100. It can in particular be provided that the sealing element seals the opening 120 at all the first contact elements 131 and second contact elements 132. The sealing element 125 can be introduced, for example, as a potting compound.

In all the described embodiments of the housing element 100, it can be provided that the first contact element 131 and/or the second contact element 132 are at least partially tin-plated. The first contact element 131 and the second contact element 132 can then be cold-welded. The tin-plating can be arranged in particular at the touch point 136 between the first contact element 131 and the second contact element 132 or a region around the touch point 136 can be tin-plated.

Figure 13:
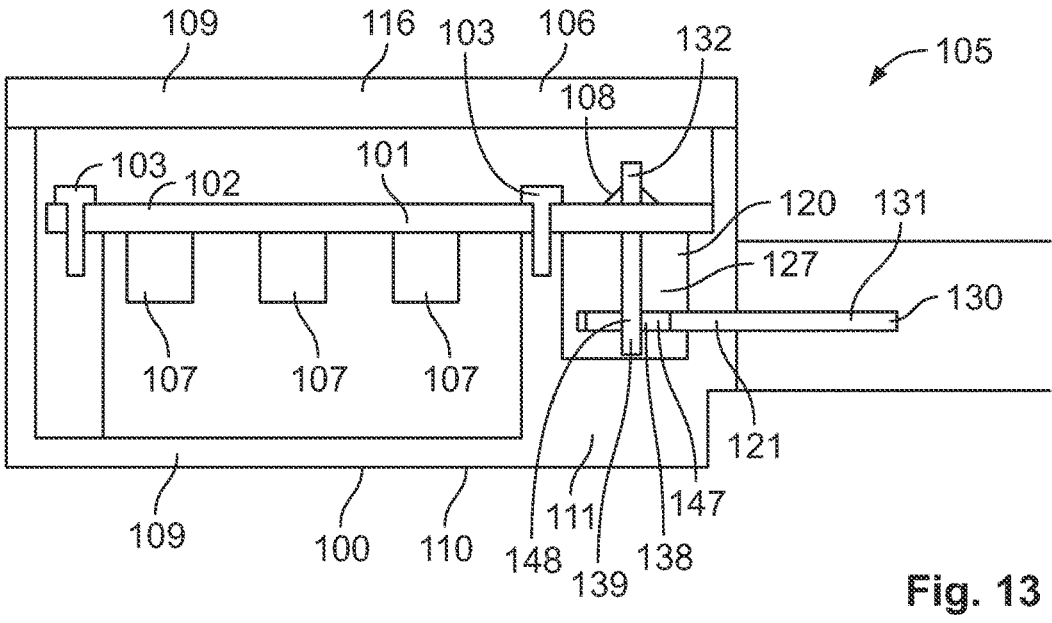
FIG. 13 shows a cross-section through an electronic component in accordance with an exemplary embodiment.

FIG. 13 shows a cross-section through an electronic component 105 which has a housing element 100 as described in connection with FIG. 10. However, the other embodiments of the housing element 100 can alternatively also be provided. The housing element body 110 is constructed as explained in connection with FIG. 4 and has in particular the housing base body 114 and the depression 115. An electronic circuit 101 in the form of a circuit board 102, for example configured as a PCB, is arranged in the depression 115. The electronic circuit 101 has components 107. The circuit board 102 and hence the electronic circuit 101 is fastened to the housing base body 114 by means of screws 103. It can be assumed that further electrical contacts 130 are present behind and in front of the plane of the drawing. The second contact elements 132 optionally pass through holes in the circuit board 102 and connected to the circuit board 102 by means of solder 108. A further housing element 106 as a housing cover 116 closes fluid-tightly a housing 109 formed from the housing element 100 and the further housing element 106.

If the second contact element 132 has the force-transmission surfaces 144, 146 explained in connection with FIGS. 8 and 11, it can be provided to introduce the forces for plugging the metal pin 148 into the slot 147 by introducing and pressing the circuit board 102 into the housing base body 114, or alternatively or additionally by means of the screws 103. If moreover the sealing element 125 is provided, a completely fluid-tight housing 109 can be produced. It can alternatively be provided that the plug element which can be attached to the collar 117 causes the housing 109 to be sealed.

It can alternatively be provided that the housing element 100 forms the housing cover 116 in a similar fashion to FIG. 2 and the electronic circuit is arranged in the housing base body 114 which then serves as a further housing element 106.

Figure 14:
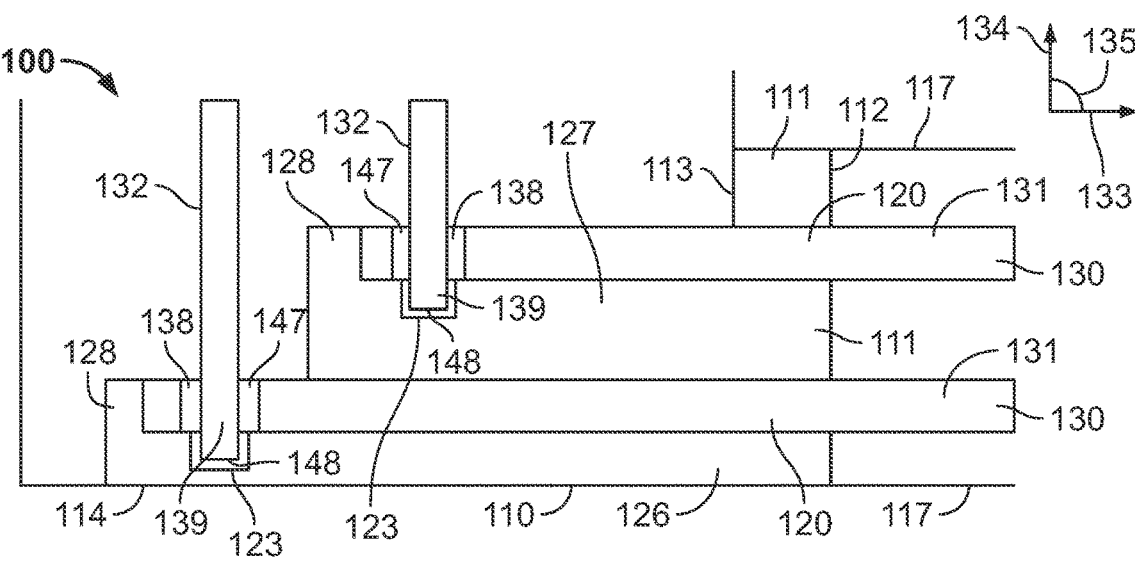
FIG. 14 shows a cross-section through a further housing element in accordance with an exemplary embodiment.

FIG. 14 shows a housing element 100 for an electronic circuit 101, wherein the housing element 100 has a housing element body 110 made from an insulating material 111. The housing element body 110 has a through opening 120, wherein the opening 120 passes from a first side 112 of the housing element body 110 to a second side 113 of the housing element body 110. The housing element 100 has an electrical contact 130, wherein the electrical contact 130 has a first contact element 131 and a second contact element 132. The first contact element 131 is connected to the second contact element 132. The first contact element 131 passes through the through opening 120. The first contact element 131 has a first direction of extent 133. The second contact element 132 has a second direction of extent 134. The first direction of extent 133 and the second direction of extent 134 have an angle 135 of at least 45 degrees and no more than 135 degrees relative to each other. In particular, it is optionally illustrated in FIG. 14 that the first direction of extent 133 and the second direction of extent 134 are perpendicular to each other, the angle 135 therefore being 90 degrees. Two electrical contacts 130 with in each case a first contact element 131 and a second contact element 132 are moreover illustrated in FIG. 14 in a similar fashion to FIG. 12. The first contact elements 131 here optionally have a recess 138 in the form of a slot 147 in a similar fashion to the already described exemplary embodiments. The second contact elements 132 have a pluggable element 139 in the form of a metal pin 148. The slot 147 can be configured as explained in connection with FIGS. 8 and 9. Instead of the slot 147 and the metal pin 148, the embodiment explained in connection with FIG. 7 can also be provided. In the case of the housing element 100 in FIG. 14, the housing material 111 is optionally shaped in such a way that it has a first support element 126 for one of the first contact elements 132 and a second support element 127 for one of the first contact elements 132. The support elements 126, 127 moreover optionally have a plug-in space for the second contact elements 132 in a similar fashion to FIGS. 8, 10, 12. The second contact elements 132 are plugged into the first contact elements 131 but do not pass through the opening 120. The support elements 126, 127 optionally moreover have a stop 128. It can be provided in the production process that the first contact elements 131 are plugged into the openings 120 from the first side 112. The stops 128 can here serve to fix a depth to which the first contact elements 131 can be plugged in. The support elements 126, 127 can serve to absorb a force on the first contact elements 131 whilst the second contact elements 132 are plugged into the first contact elements 131.

Figure 15:
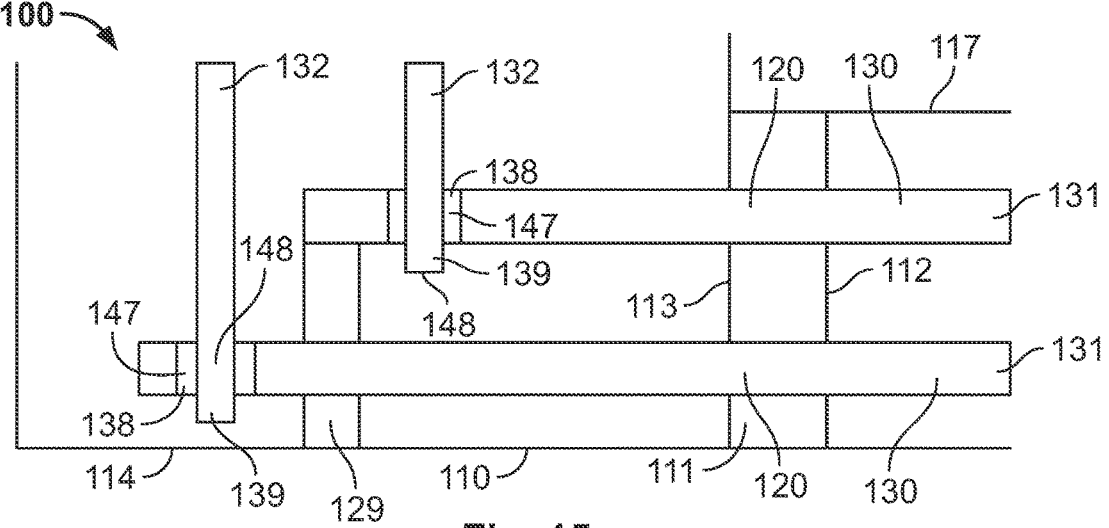
FIG. 15 shows a cross-section through a further housing element in accordance with an exemplary embodiment.

In order to produce the housing element 100 in FIG. 15, the following steps can be performed. First, the housing element body 110 is formed from insulating material 111 in such a way that the through opening 120 passes from the first side 112 of the housing element body 110 to the second side 113 of the housing element body 110. Then, the first contact element 131 is inserted into the opening 120, for example from the first side 112, wherein the first contact element 131 has the first direction of extent 133. The second contact element 132 is inserted into the housing element body 110. The second contact element 134 has the second direction of extent 134. The first contact element 131 and the second contact element 132 are then connected to form the electrical contact 130 in such a way that the first direction of extent 133 and the second direction of extent 134 have an angle of at least 45 degrees and no more than 135 degrees relative to each other, in particular are perpendicular to each other.

FIG. 15 shows a cross-section through a housing element 100 which corresponds to the embodiment in FIG. 14 except for any differences described below. The first support element 126 and the second support element 127 are not provided in this embodiment. In this exemplary embodiment, a counterpart body 129 is provided through which one of the first contact elements 131 passes and on which the other one of the first contact elements 131 bears. The counterpart element 129 here also serves to absorb a force on the first contact elements 131 whilst the second contact elements 132 are plugged into the first contact elements 131.

Figure 16:
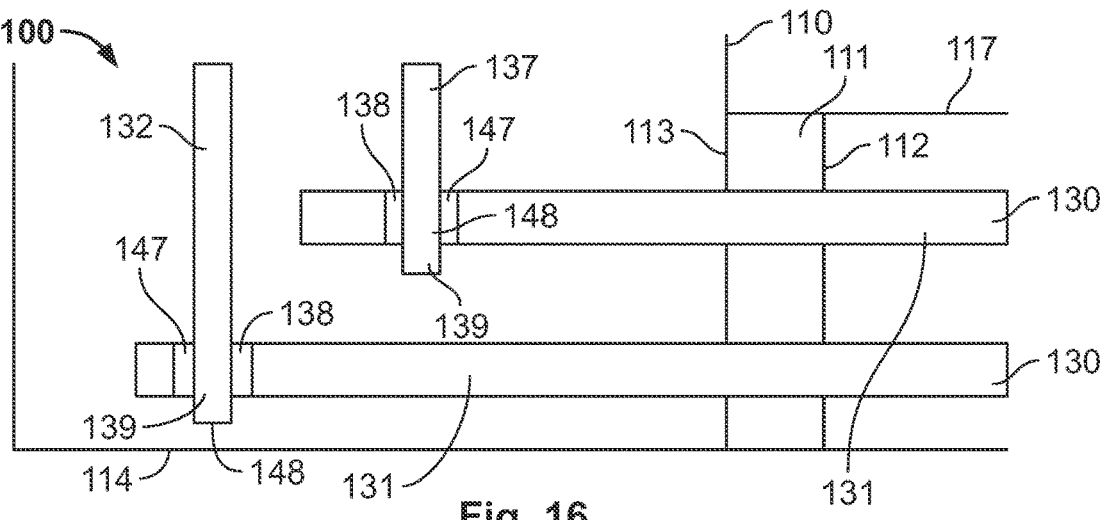
FIG. 16 shows a cross-section through a further housing element in accordance with an exemplary embodiment.

FIG. 16 shows a cross-section through a housing element 100 which corresponds to the embodiment in FIG. 14 except for any differences described below. The first support element 126 and the second support element 127 are not provided in this embodiment.

Although the invention has been described and illustrated in greater detail by way of the preferred exemplary embodiments, the invention is not restricted by the disclosed exemplary embodiments. Other variations can be derived therefrom and from the description of the invention without departing from the scope of protection of the invention.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A housing element for an electronic circuit, the housing element comprising:
    a housing element body made from an insulating material, the housing element body extending between a first side and a second side, the housing element body having a through opening, the through opening passes from the first side of the housing element body to the second side of the housing element body; and
    an electrical contact received in the housing element body, the electrical contact having a first contact element and a second contact element, the first contact element being connected to the second contact element, the first contact element passing through the through opening, wherein the first contact element has a first direction of extent and the second contact element has a second direction of extent, and wherein the first direction of extent and the second direction of extent have an angle of at least 45 degrees and no more than 135 degrees relative to each other,
    wherein the first contact element has a recess and the second contact element has a pluggable element configured to be plugged into the recess, wherein the recess is configured as a slot, wherein the pluggable element is configured as a metal pin, wherein the recess is a through hole, wherein the pluggable element is a spring element and the pluggable element is deformed when plugged into the through hole, wherein the slot has an essentially rectangular cross-section, wherein a longer side of the rectangle is directed parallel to the first direction of extent, wherein the slot has four straight sides which fundamentally form a rectangle or the slot has two parallel sides in the direction of the first direction of extent which are connected to each other by semicircular curves.

2. The housing element according to claim 1, wherein the second contact element passes through the through opening.

3. The housing element according to claim 1, wherein the slot has a greater length in the first direction of extent than a width in a direction perpendicular to the first direction of extent.

4. The housing element according to claim 1, wherein the first contact element has a plurality of recesses and the second contact element has a plurality of elements which can be plugged into the recesses.

5. The housing element according to claim 1, wherein the second contact element has a force-transmission surface.

6. The housing element according to claim 1, wherein the first contact element and the second contact element are at least partially tin-plated, and wherein the first contact element and the second contact element are cold-welded.

7. The housing element according to claim 1, wherein the through opening of the housing element body defines a non-linear path from the first side to the second side.

8. The housing element according to claim 1, wherein the housing element body has further through openings and further electrical contacts, and wherein the electrical contacts are insulated from one another by the insulating material of the housing element body along walls that separate the through openings.

9. The housing element according to claim 1, wherein a sealing element seals the opening at at least one of the first contact element and the second contact element.

10. An electronic component comprising:

a housing having a first housing element and a second housing element, the first housing element including a housing element body and an electrical contact received in the housing element body, the housing element made from an insulating material, the housing element body extending between a first side and a second side, the housing element body having a through opening, the through opening passes from the first side of the housing element body to the second side of the housing element body, the electrical contact having a first contact element and a second contact element, the first contact element being connected to the second contact element, the first contact element passing through the through opening, wherein the first contact element has a first direction of extent and the second contact element has a second direction of extent, and wherein the first direction of extent and the second direction of extent have an angle of at least 45 degrees and no more than 135 degrees relative to each other, wherein the housing is sealed fluid-tightly by the first housing element and the second housing element; and an electronic circuit received in the housing, wherein the electrical contact of the housing element is connected to the electronic circuit, wherein the first contact element has a recess and the second contact element has a pluggable element configured to be plugged into the recess, wherein the recess is configured as a slot, wherein the pluggable element is configured as a metal pin, wherein the recess is a through hole, wherein the pluggable element is a spring element and the pluggable element is deformed when plugged into the through hole, wherein the slot has an essentially rectangular cross-section, wherein a longer side of the rectangle is directed parallel to the first direction of extent, wherein the slot has four straight sides which fundamentally form a rectangle or the slot has two parallel sides in the direction of the first direction of extent which are connected to each other by semicircular curves.

11. A method for producing a housing element, the method comprising:

forming a housing element body from insulating material in such a way that a through opening passes from a first side of the housing element body to a second side of the housing element body;

introducing a first contact element into a first length of the through opening extending from the first side, wherein the first contact element has a first direction of extent and defines a recess that extends fully through the first contact element and has a round or rectangular shape, wherein the recess is configured as a slot, wherein the recess is a through hole, wherein the slot has an essentially rectangular cross-section, wherein a longer side of the rectangle is directed parallel to the first direction of extent, wherein the slot has four straight sides which fundamentally form a rectangle or the slot has two parallel sides in the direction of the first direction of extent which are connected to each other by semicircular curves;

introducing a second contact element into a second length of the through opening, wherein the first length extends transverse to the second length, wherein the second contact element has a second direction of extent and includes a pluggable element, wherein the second contact element has a pluggable element configured as a metal pin; and connecting the first contact element and the second contact element to form an electrical contact in such a way that the first direction of extent and the second direction of extent have an angle of at least 45 degrees and no more than 135 degrees relative to each other, wherein connecting the first and second contact elements comprises plugging the pluggable element into the recess, wherein, prior to connecting the first and second contact element, a minimum dimension of the recess is less than a minimum dimension of the pluggable element so that at least one of the recess or the pluggable element is deformed upon plugging the pluggable element into the recess.

12. The housing element according to claim 1, wherein the through opening of the housing element body includes a first partial opening extending from the first side and a second partial opening extending from the second side to the first partial opening, the first partial opening extending transverse to the second partial opening, wherein the first contact element extends through the first partial opening and the second contact element extends through the second partial opening.

* * * * *